United States Patent [19]
Friedrich et al.

[11] Patent Number: 5,134,533
[45] Date of Patent: Jul. 28, 1992

[54] MAGNETORESISTIVE SENSOR

[75] Inventors: Alain Friedrich; Gérard Creuzet, both of Paris, France

[73] Assignee: Thomson-CSF, Puteaux, France

[21] Appl. No.: 541,620

[22] Filed: Jun. 21, 1990

[30] Foreign Application Priority Data

Jun. 27, 1989 [FR] France .................. 89 08545

[51] Int. Cl.$^5$ .................. G11B 5/127; G11B 5/33
[52] U.S. Cl. .................. 360/113; 338/32 R
[58] Field of Search .................. 360/113, 126, 127; 338/32 R

[56] References Cited

U.S. PATENT DOCUMENTS

| | | | |
|---|---|---|---|
| 4,103,315 | 7/1988 | Hempstead | 360/110 |
| 4,616,281 | 10/1986 | Nakamura | 360/113 |
| 4,879,619 | 11/1989 | Fontana, Jr. et al. | 360/113 |
| 4,896,235 | 1/1990 | Takino et al. | 360/113 |

FOREIGN PATENT DOCUMENTS 0288766 3/1988 European Pat. Off. .
0314343 10/1988 European Pat. Off. .

*Primary Examiner*—John H. Wolff
*Attorney, Agent, or Firm*—Roland Plottel

[57] ABSTRACT

The present invention concerns a magnetroesistive sensor. In this sensor, the sensitive element is constituted by a monocrystalline magnetic metallic multilayer formed of a stack of layers of a magnetic material separated by layers of a non-magnetic material, the multilayer being constructed in such a way that the layers of magnetic material have antiferromagnetic type coupling and that of the transition between the antiparallel aligned state and the parallel aligned state occurs in a very short interval of the magnetic field.

15 Claims, 5 Drawing Sheets

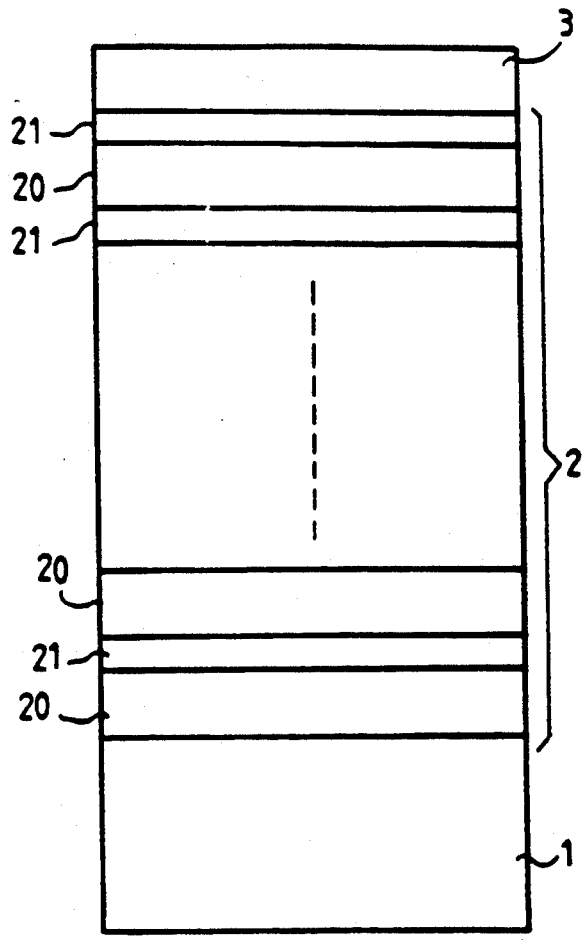
FIG_1
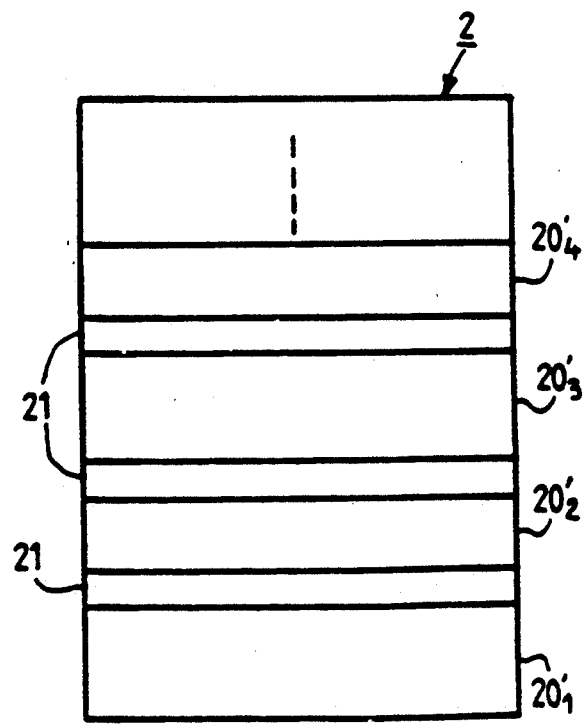
FIG_3

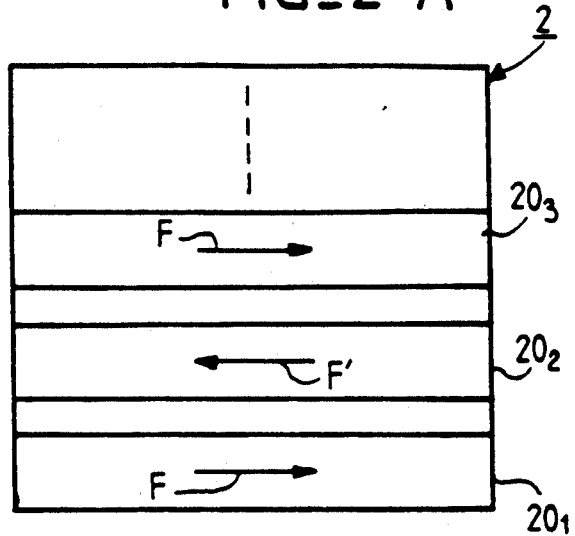
FIG_2-A
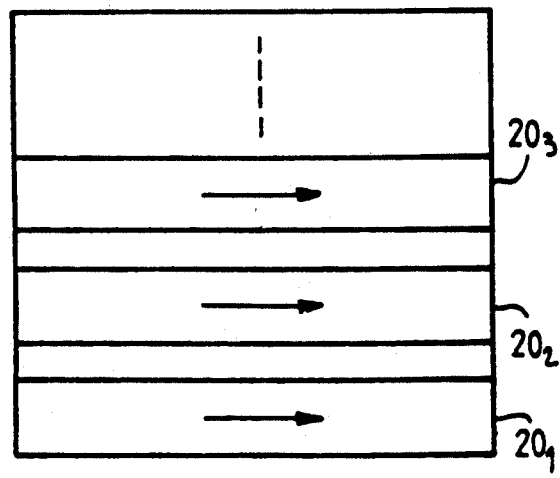
FIG_2-B

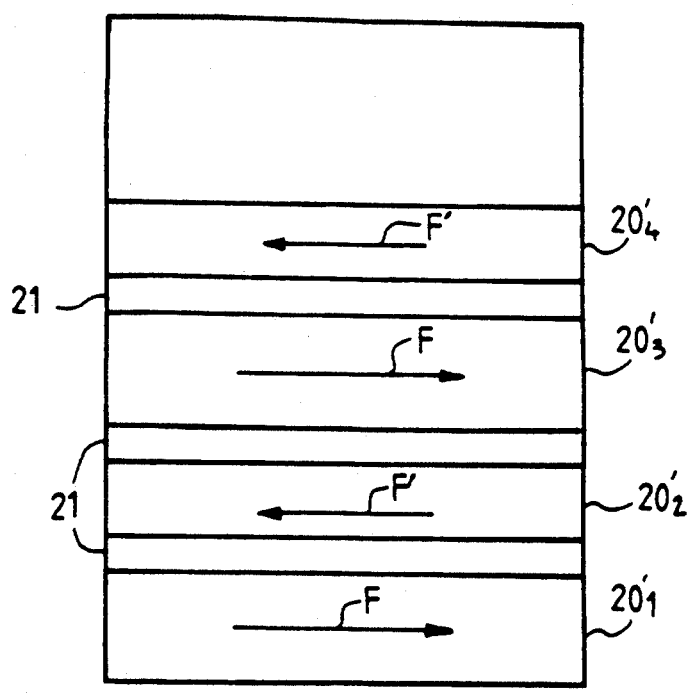
FIG_4-A
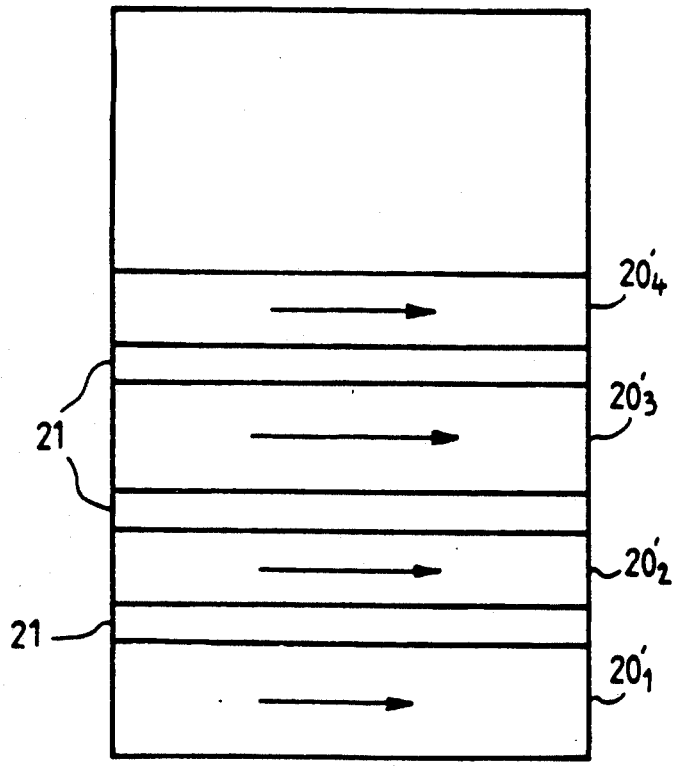
FIG_4-B

FIG_5
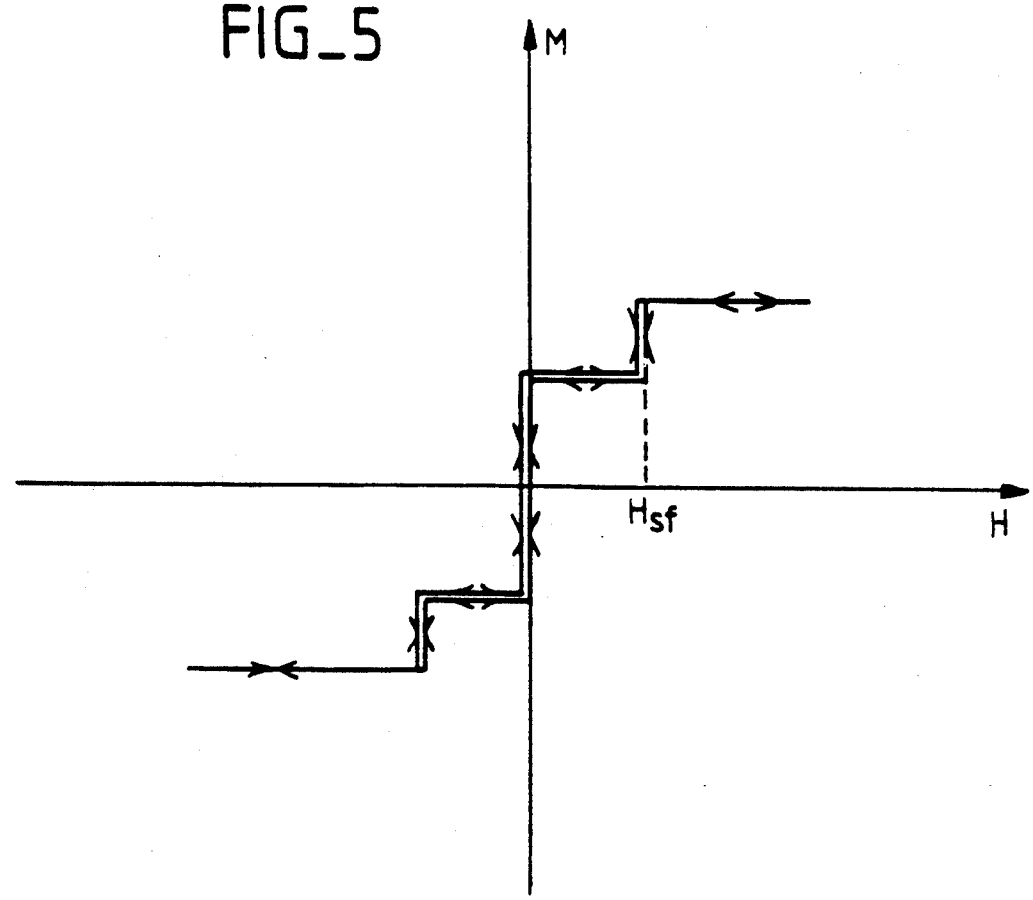
FIG_6
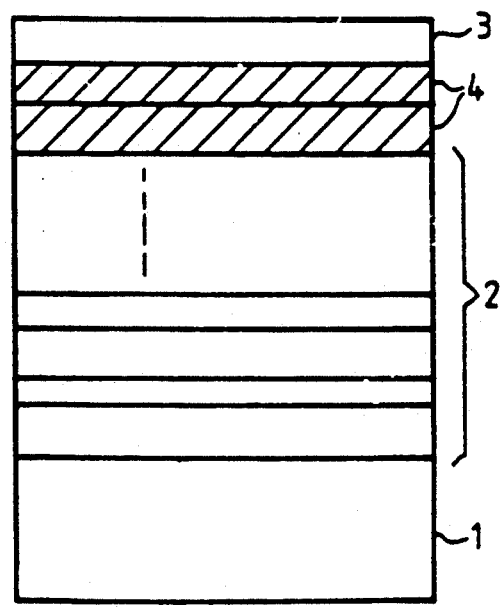

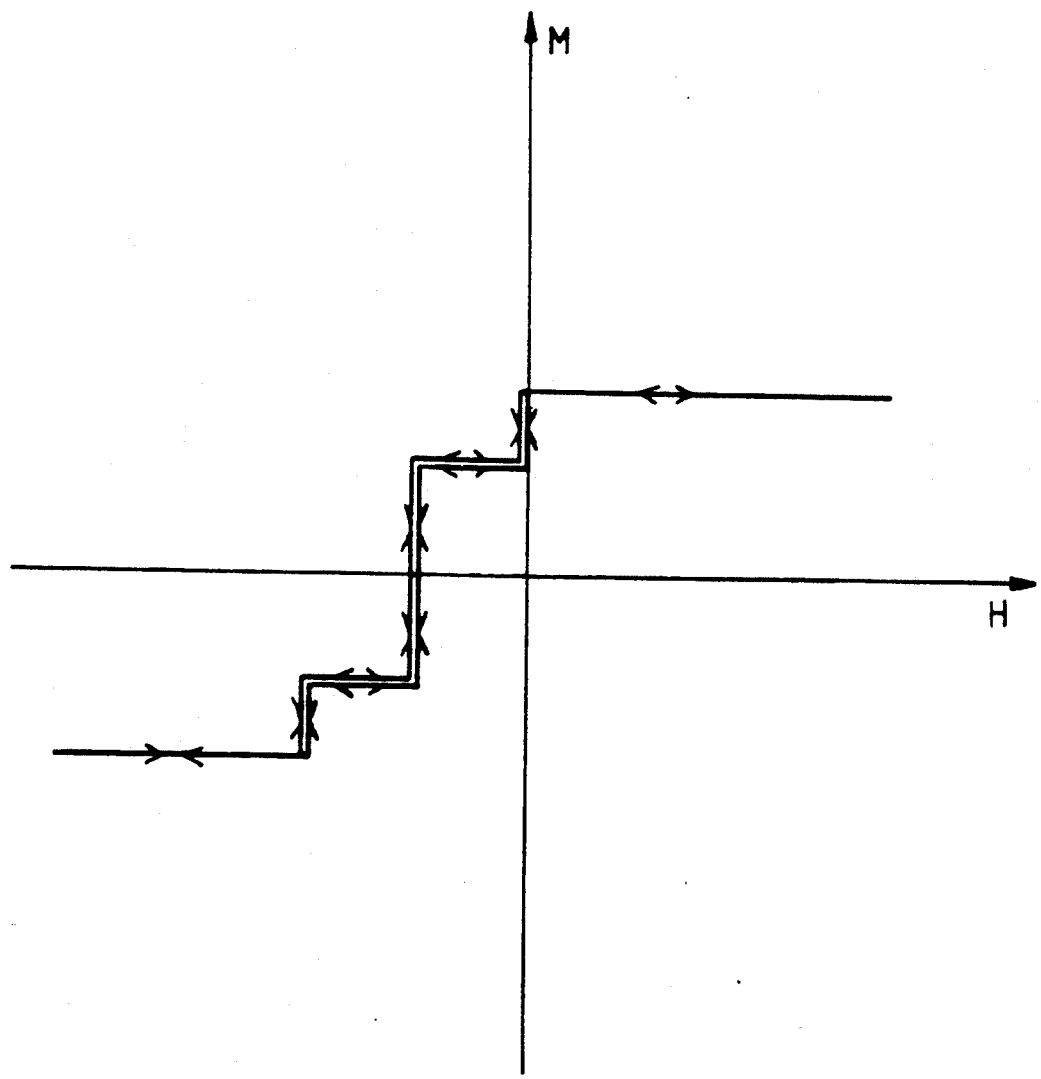
FIG_7

MAGNETORESISTIVE SENSOR

BACKGROUND OF THE INVENTION

1. Field of the Invention

The present invention concerns magnetoresistive sensors, i.e. sensors which make use of the variation in resistivity of the sensor material as a function of the variation of a magnetic field.

2. Description of the Prior Art

At present, sensors using the magnetoresistive effect are used in various systems for reading magnetic recordings. These sensors are made of a ferromagnetic alloy with high magnetoresistance which is placed in the magnetic circuit of a read head. In this case, variations of the electrical resistance of the sensor are detected as the tape passes. The highly magnetoresistive alloys used at present are generally nickel-based ferromagnetic alloys, such as $Ni_{80}Fe_{20}$ type alloys or Ni Co alloys for which the magnetoresistance at room temperature corresponds to a resistance variation of a few percent.

One of the main disadvantages of these sensors is their noise. These alloys are not monocrystalline and they have numerous magnetic domains for the magnetic fields corresponding to the functioning point of the sensor. These numerous magnetic domains are the main cause of noise.

The aim of the present invention is to remedy these disadvantages by proposing a new structure for the sensitive element of magnetoresistive sensors.

SUMMARY OF THE INVENTION

Thus, the object of the present invention is a magnetoresistive sensor, characterized by the fact that the sensitive element of the sensor is constituted by a monocrystalline magnetic metallic multilayer formed of a stack of layers of a magnetic material separated by layers of a non-magnetic material, the multilayer being made in such a way that the layers of magnetic material present antiferromagnetic-type coupling and that the transition between the state of antiparallel alignment and that of parallel alignment takes place over a very short interval of the magnetic field.

The magnetic material used in the magnetic metallic multilayer is preferably iron, cobalt or nickel and the non-magnetic material chromium, vanadium or titanium.

The layers of magnetic material have a thickness of between 9 and 90 Å and the layers of non-magnetic material a thickness of less than 30 Å.

Thus, using certain types of magnetic and non-magnetic materials, associated in a specific structure, high magnetoresistance was observed in a limited field domain, therefore suitable for use as the sensitive element of a magnetoresistive sensor. This high magnetoresistance observed notably for Fe/Cr magnetic metallic multilayers is due to the transition, in a magnetic field, between the two states of magnetization of the system, i.e. the state where alternating magnetizations of the magnetic layers are antiparallel and the state where all these magnetizations are parallel.

According to another characteristic of the present invention, the layers of magnetic material are alternatively thin and thick with a ratio between the thicknesses of between 1:1 and 1:3.

In this case, the transition between the antiparallel alignment state and the parallel alignment state will be of spin-flip type (i.e.: by sudden return of the magnetization of the thin layers to a given field called the spin-flip field).

According to another characteristic of the present invention, the layers of magnetic material are of the same thickness, the multilayer then presenting uni-axial anisotropy in the plane of the layers.

According to still another characteristic of the present invention, the magnetic metallic multilayer is covered with at least one additional layer with fixed magnetization. In this case, the "spin-flip" magnetic field is displaced towards very weak fields. This solution enables the polarizing magnetic field necessary when the system does not function near a null field to be reduced or perhaps even eliminated.

BRIEF DESCRIPTION OF THE DRAWINGS

Other characteristics and advantages of the present invention will appear on reading the description below of various modes of embodiment of a magnetoresistive sensor with reference to the appended drawings of which:

FIG. 1 is a schematic section view of a first mode of embodiment of a magnetoresistive sensor in accordance with the present invention;

FIGS. 2A and 2B are section views of the sensitive element of the sensor explaining the functioning of this sensor;

FIG. 3 is a schematic section view of the sensitive element of a magnetoresistive sensor according to another mode of embodiment of the present invention;

FIGS. 4A and 4B are views similar to FIG. 3 explaining functioning of the said sensor;

FIG. 5 represents the hysteresis loop of the sensor in FIG. 3;

FIG. 6 is a schematic section view of a third mode of embodiment of a magnetoresistive sensor in accordance with the present invention, and FIG. 7 represents the hysteresis loop of a sensor such as that in FIG. 6.

To simplify the description, the same elements have the same references in all the figures. For the sake of clarity, the thicknesses of the different layers have not been shown to scale.

DESCRIPTION OF THE PREFERRED EMBODIMENTS

As represented in FIG. 1, a magnetoresistive sensor comprises essentially a substrate 1, a monocrystalline magnetic metallic multilayer 2 formed of a stack of layers 20 of magnetic material separated by layers 21 of non-magnetic material, and covered by an encapsulating layer 3. The substrate 1 is made either of an insulating material or of a non-doped semiconducting material such as gallium arsenide (GaAs).

On this substrate 1 is deposited a monocrystalline magnetic metallic multilayer. In fact, the substrate 1 must have an appropriate lattice structure so that the growth of the multilayer gives a monocrystal. To obtain this monocrystal, growth techniques such as epitaxial growth are used, preferably molecular beam epitaxy (MBE). Thus, with a single crystal, for a given layer, the magnetic states are single-domain, which has the main advantage of considerably reducing the associated noise.

In accordance with the present invention, the magnetic material of the layers 20 is iron, cobalt, nickel or an alloy of these metals, and the non-magnetic material of the layers 21 is manganese, chromium, vanadium or titanium. The layers 20 of magnetic material are between 9 and 90 Å thick while the layers 21 of non-magnetic material are less than 30 thick, so that a particular multilayer structure is obtained. With the above structure used for the multilayer 2, the coupling between the magnetic layers $20_1$, $20_2$, $20_3$ as represented in FIG. 2A is of antiferromagnetic type, i.e. it has antiparallel alignment symbolised by the arrows F and F' in FIG. 2A, for the magnetizations of the layers. The structure of the multilayer is such that it passes from the antiparallel alignment of FIG. 2A to a parallel alignment as represented in FIG. 2B for a very short interval of the magnetic field, a few Gauss, either from a null field or from a finite field. In the latter case, a polarizing magnetic field must be used to fix the sensor functioning point near this field.

It is in fact this transition between the state shown in FIG. 2A and that in FIG. 2B which induces a strong magnetoresistance in the type of structure described above Thus, the obtention of strong magnetoresistance associated with the transition from the antiparallel aligned state to a parallel aligned state can be explained thanks to the notion of resistivity depending on spin for impurities in ferromagnetic materials such as iron, cobalt or nickel. In fact, the state of parallel alignment possesses a low resistance if a non-magnetic material is chosen which diffuses the conduction electrons very little for at least one direction of spin. On the other hand, the antiparallel aligned state will have greater resistivity. Thus, to be able to make a magnetoresistive sensor, using a monocrystalline magnetic metallic multilayer as the sensitive element, this multilayer must have a particular structure and be formed of specific ferromagnetic and non-magnetic materials so that the layers of magnetic material present an antiferromagnetic-type coupling and the transition between the antiparallel aligned state and the parallel aligned state must take place on a very short interval of the magnetic field. In fact, following studies performed notably on Fe/Cr-type multilayers, it was noted that obtention of strong magnetoresistance is closely related to the nature of the non-magnetic material. It can be considered that the diffusion by the thin non-magnetic layer in the case of a parallel arrangement as represented in FIG. 2B is similar to that of impurities of the non-magnetic material in the magnetic material. This explains the choice of the non-magnetic material. However, the use of certain materials as the base element of a magnetoresistive sensor also depends on the fact that the coupling between the magnetic layers is of antiferromagnetic type and that the transition between the antiparallel aligned state and the parallel aligned state occurs on a very short field interval.

In a general way, it can be supposed that non-magnetic layers of any transition metal, owing to the strong tendency of the electrons of the layer of the d shell to be magnetically polarised, will establish a coupling between magnetic layers for thicknesses of the same order of magnitude. However, depending on the type of non-magnetic material used, this coupling can be a ferromagnetic coupling or an antiferromagnetic coupling, which explains the choice of non-magnetic materials.

In addition, depending on the position in the magnetic field of the transition between the parallel alignments and the antiparallel alignments, a polarization field can be used to polarize the system in the neighborhood of the transition field.

In FIG. 3 is represented a variant embodiment of the monocrystalline magnetic metallic multilayer 2 of a magnetoresistive sensor. In this case, the magnetic layers $20'_1$, $20'_2$, $20'_3$ and $20'_4$ are constituted of layers of variable thicknesses. In the mode of embodiment shown, layers $20'_1$ and $20'_3$ are thick layers while layers $20'_2$ and $20'_4$ are thin layers. In fact, the layers must be made in such a way that their thickness is in a ratio of 1 to 3.

As represented in FIGS. 4A and 4B, the transition between the antiparallel aligned state in FIG. 4A and the parallel aligned state in FIG. 4B will then be of the "spin-flip" type. Thus, a weak magnetic field begins by orienting the magnetization of the thick layers $20'_1$, $20'_3$ in its direction, the thin layers $20'_2$, $20'_4$ having their magnetization in the opposite direction F'. A characteristic field or "spin-flip" field $H_{sf}$ will then suddenly reverse the magnetization of the thin layers $20'_2$ and $20'_4$ in the mode of embodiment represented. In this case, the hysteresis loop represented in FIG. 5 is obtained. It is then necessary to use a polarization field $H_b$ whose value is very close to that of $H_{sf}$ so that the transition occurs for the application of a magnetic field of the order of magnitude of that used in reading magnetic tapes.

In fact, a hysteresis loop such as that represented in FIG. 5 can also be obtained with magnetic metallic multilayers possessing magnetic layers of equal thickness, if the system has uni-axial anisotropy in the plane of the layers, as for example when the system is formed with bcc or fcc (110)-type epitaxy.

In FIG. 6 is represented a third mode of embodiment of a magnetoresistive sensor in accordance with the present invention. In this case, on the magnetic metallic multilayer 2 has been deposited at least one additional layer 4 (two in this embodiment) with magnetization fixed in a given direction. This additional layer with fixed magnetization is constituted, for example, of a thick layer of iron.

These additional layers enable the "spin-flip" field $H_{sf}$ to be displaced towards very weak magnetic fields. The process used to shift the "spin-flip" magnetic field $H_{sf}$ is then the conventional process of exchange anisotropy with these additional layers. This solution enables the polarization field $H_b$ to be either reduced or even totally eliminated. The hysteresis loop obtained in the latter case is a loop like that in FIG. 7.

What is claimed is:

1. Magnetoresistive sensor, characterized by the fact that the sensitive element of the sensor is constituted of a monocrystalline magnetic metallic multilayer formed of a stack of layers of a magnetic material separated by layers of a non-magnetic material, the multilayer being constructed in such a way that the layers of magnetic material have antiferromagnetic coupling and that the transition between antiparallel aligned state and parallel aligned state takes place on a very weak magnetic field interval.

2. Magnetoresistive sensor according to claim 1, wherein the magnetic material is iron, cobalt or nickel.

3. Magnetoresistive sensor according to claim 1, wherein the non-magnetic material is manganese, chromium, vanadium or titanium.

4. Magnetoresistive sensor according to any one of claims 1 to 3, wherein the layers of magnetic material have a thickness of between 9 and 90 Å.

5. Magnetoresistive sensor according to claim 1, wherein the layers of non-magnetic material have a thickness of less than 30 Å.

6. Magnetoresistive sensor according to claim 1, wherein the layers of magnetic material are alternately thin and thick with a ratio of 1 to 3 between the thicknesses.

7. Magnetoresistive sensor according to claim 1, wherein the layers of magnetic material are of the same thickness and wherein the multilayer has uniaxial anisotropy in the plane of the layers.

8. Magnetoresistive sensor according to claim 1, wherein the magnetic metallic multilayer is covered with at least one additional layer of fixed magnetization.

9. Magnetoresistive sensor according to claim 1, wherein the magnetic metallic multilayer covered with a thick layer of iron.

10. Magnetoresistive sensor according to claim 1, wherein the magnetic field interval is of the order of a few Gauss.

11. Magnetoresistive sensor according to claim 1, characterized by the fact that it is polarized by a polarization field near the transition field.

12. Magnetoresistive sensor according to claim 1, wherein the multilayer is deposited on a substrate.

13. Magnetoresistive sensor according to claim 12, wherein the substrate is made of an insulating material or a non-doped semiconducting material with an appropriate lattice structure.

14. Magnetoresistive sensor according to claim 12 or 13, wherein the deposition is performed using an epitaxy technique such as molecular beam epitaxy.

15. Magnetoresistive sensor according to claim 1, wherein the multilayer is covered with an encapsulating layer.

* * * * *